(12) United States Patent
Weng et al.

(10) Patent No.: US 12,142,332 B2
(45) Date of Patent: Nov. 12, 2024

(54) TESTING CIRCUIT FOR A MEMORY DEVICE

(71) Applicant: Micron Technology, Inc., Boise, ID (US)

(72) Inventors: Chunqiang Weng, Shanghai (CN); Jingwei Cheng, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 17/939,491

(22) Filed: Sep. 7, 2022

(65) Prior Publication Data

US 2023/0077784 A1 Mar. 16, 2023

Related U.S. Application Data

(60) Provisional application No. 63/243,956, filed on Sep. 14, 2021.

(51) Int. Cl.
*G11C 29/12* (2006.01)

(52) U.S. Cl.
CPC .............................. *G11C 29/1201* (2013.01)

(58) Field of Classification Search
None
See application file for complete search history.

(56) References Cited

U.S. PATENT DOCUMENTS

| 7,941,916 | B1 * | 5/2011 | Hsueh | H05K 3/284 29/841 |
| 10,790,039 | B1 * | 9/2020 | Lee | H01L 25/0652 |
| 2019/0341370 | A1 * | 11/2019 | Keeth | H01L 25/0657 |
| 2020/0303032 | A1 * | 9/2020 | Hirotsu | G11C 29/04 |

FOREIGN PATENT DOCUMENTS

KR 20110054542 A * 5/2011

\* cited by examiner

*Primary Examiner* — Guerrier Merant
(74) *Attorney, Agent, or Firm* — Holland & Hart LLP

(57) ABSTRACT

Methods, systems, and devices for testing circuit for a memory device are described. An apparatus may include a memory system including contacts that route signals to different regions of the memory system. The apparatus may include a first substrate including a memory system interface coupled with the memory system and a probe interface. The apparatus may also include a second substrate coupled with a host system interface of the first substrate and receive the signal of the memory system from the memory system interface. The first interface may route a signal of the memory system to the probe interface and a tester to determine the signal's integrity and any errors associated with the memory system. The first substrate may include a resistor coupled with the contacts of the memory system, the resistor on a surface of the interface may be configured to improve the signal at the tester.

25 Claims, 4 Drawing Sheets

TESTING CIRCUIT FOR A MEMORY DEVICE

CROSS REFERENCE

The present application for patent claims the benefit of U.S. Patent Application No. 63/243,956 by Weng et al., entitled "TESTING CIRCUIT FOR A MEMORY DEVICE," filed Sep. 14, 2021, assigned to the assignee hereof, and is expressly incorporated by reference in its entirety herein.

FIELD OF TECHNOLOGY

The following relates generally to one or more systems for memory and more specifically to testing circuit for a memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, 3-dimensional cross-point memory (3D cross point), not-or (NOR) and not-and (NAND) memory devices and others. Memory cells may be volatile or non-volatile. Non-volatile memory, e.g., FeRAM or NAND memory cells, may maintain their stored logic state for extended periods of time even in the absence of an external power source. Volatile memory devices, e.g., DRAM, may lose their stored state in response to being disconnected from an external power source.

DETAILED DESCRIPTION

Figure 1:
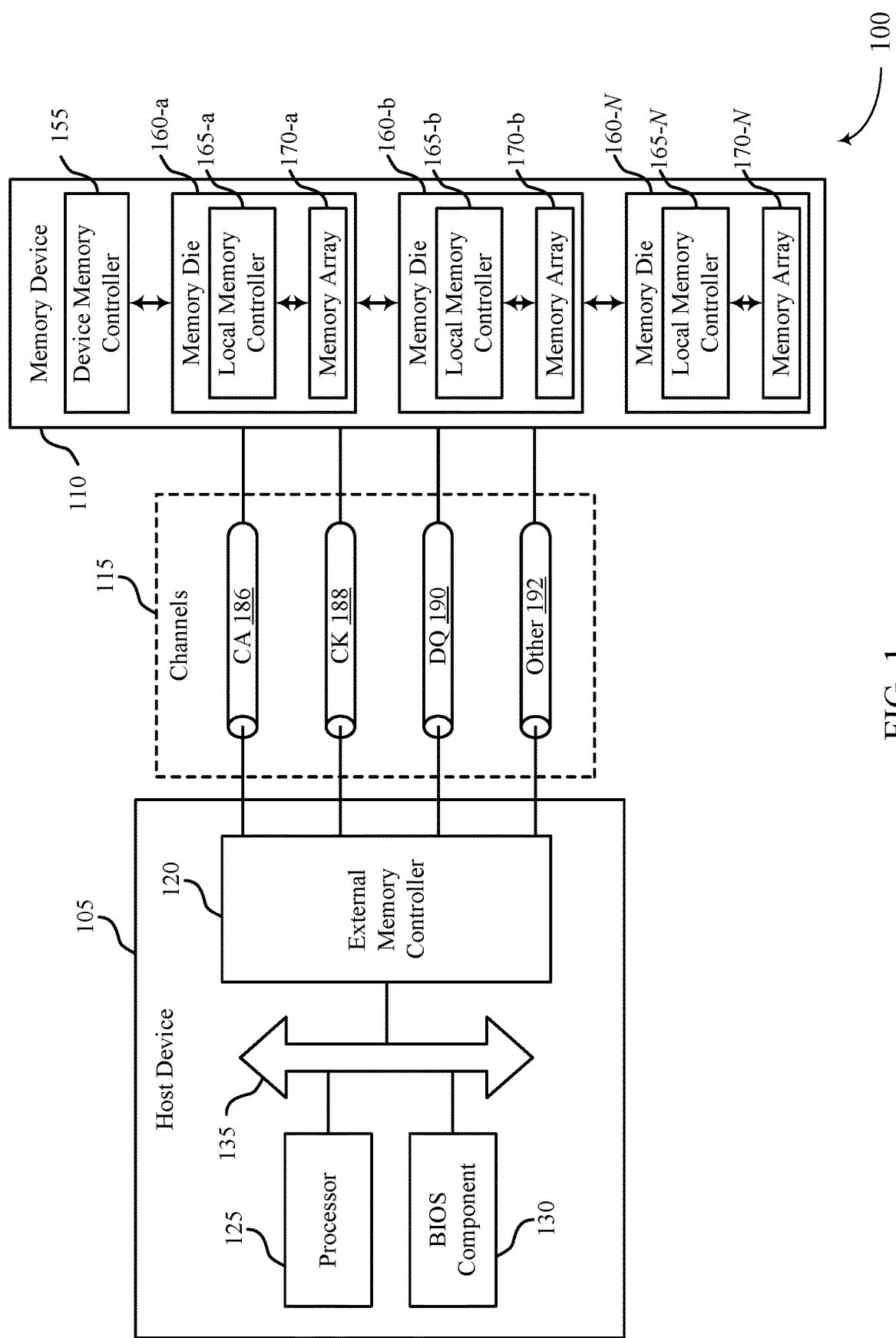
FIG. 1 illustrates an example of a system that supports testing circuit for a memory device in accordance with examples as disclosed herein.

A system may include a memory system and a host system coupled with the memory system via a first substrate. In some examples, the memory system may communicate signals and commands with the host device to perform operations—e.g., access operations including read, write, and refresh operations. For example, the memory device may communicate the signals over one or more command and address (CA) channels or one or more data (DQ) channels. In some examples, a user of the memory system may measure signals communicated to determine integrity and timing of the signals and detect any errors of the memory system. In some examples, it may be difficult to measure the signals communicated between the host system and memory system because the resulting devices are relatively small. In one example, to test the communications between the memory system and the host system, an interposer (e.g., a substrate or wire) may be positioned between the memory system and the host system. The interposer may be configured to route signals communicated between the memory system and the host system to an interface that is configured to couple with a tester. In such examples, an impedance of the interposer or tester can affect the signal being communicated between the memory system and the host system, thereby reducing the accuracy of the measured signal. To reduce such effects, the interposer may include an isolation resistor that isolates the tester and interposer from the original signal at the memory system. The effectiveness of the isolation resistor may be based on a distance between the resistor and contacts (e.g., electrical junctions or ballout) of the memory system. In other examples, interposers may include a buried resistor to mitigate impacts of the impedance of the tester and interposer on the communicated signal. In such examples, a cost and duration of manufacturing the interposer may be relatively large—e.g., manufacturing an interposer with a buried resistor may be expensive and time consuming. Additionally, the accuracy of the interposer with the buried resistor may be ±twenty percent (20%). Such variations may reduce the signal measurement accuracy.

Systems, devices, and techniques are described herein for a substrate (e.g., interposer) with a resistor on the surface to improve an isolation provided by the resistor if coupled with a memory system and a tester to measure the signal. For example, in lieu of the buried resistor, the interposer may include a resistor coupled with a surface of the interposer. The interposer may be coupled with the memory system using memory system contacts and the resistor may be coupled with the memory system contacts—e.g., electrical junctions or ballout. In some examples, the resistor may be an example of a 01005 resistor that is positioned on the surface of the interposer. In some examples, having the resistor on the surface of the interposer may allow the resistor to be closer to a memory system interface (e.g., the contacts or BGA ball) as compared to other interposers that may use buried resistors. Accordingly, the isolation of the resistor may improve and mitigate the effects of the interposer and the tester coupled with the memory system. That is, the impact of a probe point on the interposer may be reduced. In such examples, a signal measured at the tester may be accurate of an original communicated by the memory system—e.g., measurement of the signal may be greatly improved compared to other solutions. In some examples, a cost and duration of manufacturing an interposer with the resistor on the surface may be relatively small.

Features of the disclosure are initially described in the context of systems and dies as described with reference to FIG. 1. Features of the disclosure are described in the context of systems and an interface as described with reference to FIGS. 2-4.

FIG. 1 illustrates an example of a system 100 that supports testing circuit for a memory system in accordance with examples as disclosed herein. The system 100 may include a host system 105, a memory system 110, and a plurality of channels 115 coupling the host system 105 with the memory system 110. The system 100 may include one or more memory systems 110, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory system 110 may be a component of the system operable to store data for one or more other components of the system 100.

At least portions of the system 100 may be examples of the host system 105. The host system 105 may be an example of a processor or other circuitry within a system that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host system 105 may refer to the hardware, firmware, software, or a combination thereof that implements the functions of an external memory controller 120. In some examples, the external memory controller 120 may be referred to as a host or a host system 105.

A memory system 110 may be an independent system or a component that is operable to provide physical memory addresses/space that may be used or referenced by the system 100. In some examples, a memory system 110 may be configurable to work with one or more different types of host systems. Signaling between the host system 105 and the memory system 110 may be operable to support one or more of: modulation schemes to modulate the signals, various pin configurations for communicating the signals, various form factors for physical packaging of the host system 105 and the memory system 110, clock signaling and synchronization between the host system 105 and the memory system 110, timing conventions, or other factors.

The memory system 110 may be operable to store data for the components of the host system 105. In some examples, the memory system 110 may act as a secondary-type or dependent-type system to the host system 105 (e.g., responding to and executing commands provided by the host system 105 through the external memory controller 120). Such commands may include one or more of a write command for a write operation, a read command for a read operation, a refresh command for a refresh operation, or other commands. The memory system 110 may include DRAM memory cells, NAND memory cells, chalcogenide-based memory cells, FeRAM memory cells, other types of memory cells, or any combination thereof. In other examples, the memory system 110 may include memory cells of other technologies (e.g., RAM, ROM, SDRAM, SRAM, FeRAM, MRAM, RRAM, flash memory, PCM, 3D cross point, NOR, or others). In some examples, memory system 110 may have a contact layout (e.g., ballout) with a pitch of greater than or equal to 65 mm as described with reference to FIG. 4.

The host system 105 may include one or more of an external memory controller 120, a processor 125, a basic input/output system (BIOS) component 130, or other components such as one or more peripheral components or one or more input/output controllers. The components of the host system 105 may be coupled with one another using a bus 135.

The processor 125 may be operable to provide control or other functionality for at least portions of the system 100 or at least portions of the host system 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105. The BIOS component 130 may include a program or software stored in one or more of read-only memory (ROM), flash memory, or other non-volatile memory.

The memory system 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory system 110 including two or more memory dies 160 may be referred to as a multi-die memory or a multi-die package or a multi-chip memory or a multi-chip package.

The device memory controller 155 may include circuits, logic, or components operable to control operation of the memory system 110. The device memory controller 155 may include the hardware, the firmware, or the instructions that enable the memory system 110 to perform various operations and may be operable to receive, transmit, or execute commands, data, or control information related to the components of the memory system 110. The device memory controller 155 may be operable to communicate with one or more of the external memory controller 120, the one or more memory dies 160, or the processor 125. In some examples, the device memory controller 155 may control operation of the memory system 110 described herein in conjunction with the local memory controller 165 of the memory die 160.

In some examples, the memory system 110 may receive data or commands or both from the host system 105. For example, the memory system 110 may receive a write command indicating that the memory system 110 is to store data for the host system 105 or a read command indicating that the memory system 110 is to provide data stored in a memory die 160 to the host system 105. The memory system 110 may also receive other signaling from the host system 105 via a substrate.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory system 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host system 105 (e.g., the processor 125) and the memory system 110. The external memory controller 120 may convert or translate communications exchanged between the components of the host system 105 and the memory system 110. In some examples, the external memory controller 120 or other component of the system 100 or the host system 105, or its functions described herein, may be implemented by the processor 125. For example, the external memory controller 120 may be hardware, firmware, or software, or some combination thereof implemented by the processor 125 or other component of the system 100 or the host system 105. Although the external memory controller 120 is depicted as being external to the memory system 110, in some examples, the external memory controller 120, or its functions described herein, may be implemented by one or more components of a memory system 110 (e.g., a device memory controller 155, a local memory controller 165) or vice versa.

The components of the host system 105 may exchange information with the memory system 110 using one or more channels 115. The channels 115 may be operable to support communications between the external memory controller 120 and the memory system 110. Each channel 115 may be examples of transmission mediums that carry information between the host system 105 and the memory system. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host system 105 and one or more pins or pads at the memory system 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal). In some examples, channels 115 may be in a substrate coupling the host system 105 and the memory system 110.

In some examples, CA channels 186 may be operable to communicate commands between the host system 105 and the memory system 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host system 105 and the memory system 110. Each clock signal may be operable to oscillate between a high state and a low state, and may support coordination (e.g., in time) between actions of the host system 105 and the memory system 110. In some examples, the clock signal may be single ended. In some examples, the clock signal may provide a timing reference for command and addressing operations for the memory system 110, or other system-wide operations for the memory system 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host system 105 and the memory system 110. For example, the data channels 190 may communicate information (e.g., bi-directional) to be written to the memory system 110 or information read from the memory system 110.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory system 110 may be tested to determine whether signals communicated with the memory system 110 include errors. That is, an integrity of a signal communicated with the memory system 110 (either transmitted by or received by the memory system 110) may be measured. In such examples, the memory system 110 may be coupled with a testing circuit configured to debug or measure signal integrity of the memory system. For example, the memory system 110 may be coupled with a first substrate. In some examples, the first substrate may be coupled with the memory system 110 and the host system 105. The first substrate may include a resistor on a surface that is configured to couple between contacts (e.g., between ballouts) of the memory system 210. The first substrate may further include an interface configured to couple with a probe of a tester. In such examples, the tester may measure a signal of the memory system 110 at the contact. By having the resistor on the surface of the first interface and close to the contacts, the tester may measure the signal more accurately. Additionally, by having the resistor on the surface, a cost and duration associated with manufacturing the first interface may be reduced.

Figure 2:
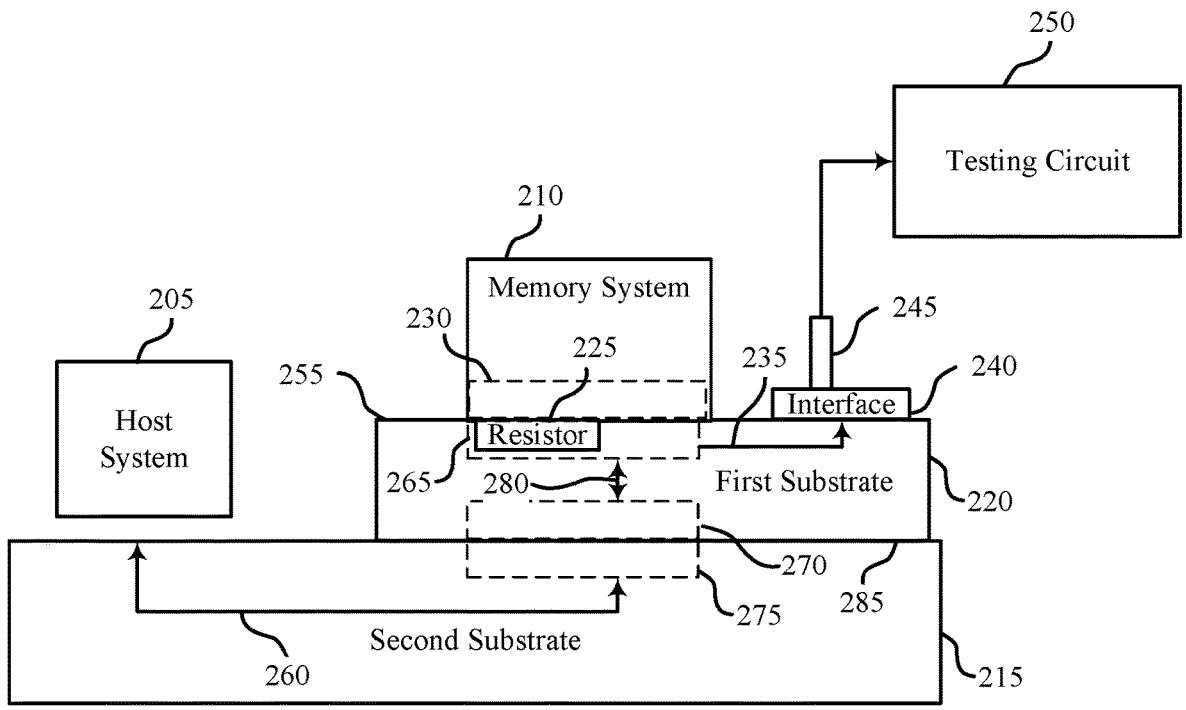
FIG. 2 illustrates an example of a system that supports testing circuit for a memory device in accordance with examples as disclosed herein.

FIG. 2 illustrates an example of a system 200 that supports testing circuit for a memory device in accordance with examples as disclosed herein. System 200 may include a host system 205 coupled with a memory system 210 via a second substrate 215. The host system 205 may be an example of host system 105 as described with reference to FIG. 1. The system 200 may also include a first substrate 220 coupled with the second substrate 215 and the memory system 210. Memory system 210 may be an example of memory system 110 as described with reference to FIG. 1. The first substrate 220 may also further include a resistor 225 on a surface 255 of the first substrate 220. In some examples, the system 200 may also include a plurality of interfaces, such as an interface 230 of the memory system 210, an interface 265 of the first substrate 220, an interface 270 of the first substrate 220, an interface 240 of the first substrate 220 (e.g., a probe interface or probe point), and an interface 275 of the second substrate 215. The interfaces may be examples of contacts, BGA balls, electrical junctions, etc. that allow conductive lines of different components to be coupled together. In some examples, the interface 265 and the interface 275 may be referred to as memory system interfaces because they are configured to couple with the interface 230 of the memory system. In some cases, the interface 230 and the interface 270 may be referred to host system interfaces because they are configured to couple with the interface 275 and the signals be routed to the host system 205. The interface 230 may be configured to couple with the interface 265 of the first substrate 220 and the interface 275 of the substrate 215. The interface 275 may be configured to couple with the interface 230 of the memory system 210 and the interface 270 of the first substrate 220.

The system 200 may also include a probe 245 and a testing circuit 250. In some cases, the methods as disclosed herein may be performed during a test operation of the memory system 210. A user of the memory system 210 may initiate the test operation. In such examples, the first substrate and testing circuit 250 may be utilized. In other examples, in response to the memory system 210 operating according to normal operations, the system 200 may not include the first substrate 220 or the testing circuit 250.

The host system 205 may be configured to communicate signals (e.g., commands (CA signals) or data (DQ signals)) with the memory system 210 via the second substrate 215. For example, the host system 205 may communicate access commands (e.g., read, write, or refresh commands) to the memory system 210. In other examples, the host system 205 may transmit data to store at the memory system 210.

The memory system 210 may be configured to receive command signals from the host system 205. In some examples, the memory system 210 may be configured to receive data from or send data to the host system 205—e.g., the memory system 210 may transmit and receive signals from the host system 205. In some examples, the memory system 210 may include an interface 230. In some examples, the interface 230 may include contacts (e.g., BGA balls) and be configured to couple with the first substrate 220 (e.g., using interface 265) or the second substrate 215 (e.g., using interface 275). In some examples, the interface 230 may be configured to route signals received from the host system 205 to various components within the memory system 210—e.g., to device memory controller 155 or a memory die 160. In some examples, e.g., during a test operation, the memory system 210 may be configured to couple with the first substrate 220 and resistor 225 (e.g., coupling with interface 265). In such examples, the memory system 210 may be configured to route signals to the interface 240 and the testing circuit 250. The memory system 210 may also be configured to route signals to the host system 205 via the first substrate 220 (e.g., using the interface 265 and interface 270) and the second substrate 215 (e.g., using interface 275 and any other interfaces that may be positioned between the host system 205 and the second substrate 215). The first substrate 220 may include conductive lines 280 (e.g., channels 115) that are used to communicate between the interface 265 and the interface 270.

The second substrate 215 may be configured to communicate signals between the memory system 210 and the host system 205. That is, substrate 215 may support and couple the components of the host system 205 with the components of the memory system 210. For example, the substrate 215 may include conductive lines 260 (e.g., channels 115) that are used to communicate between the interface 275 and the host system 205. In some examples, the substrate 215 may be a printed circuit board (PCB). The interface 275 of the substrate 215 may be configured to couple with the interface 230 of the memory system 210 during a normal operating mode of the memory system 210. In other examples, the interface 275 of the second substrate 215 may be configured to couple with the interface 270 of the first substrate 220 during a testing operation.

First substrate 220 may be configured to communicate a signal associated with the memory system 210 to an interface. The interface may be configured to be coupled with a probe 245 of a testing circuit 250, which may measure signal integrity of signals communicated by the memory system 210. In some examples, the testing circuit may also be configured to determine errors associated with signals communicated between the memory system 210 and the host system 205. In some examples, the first substrate 220 may be configured to route signals from the memory system 210 to the testing circuit 250 via the interface 265 (and the resistor 225), a conductive line 235 (e.g., transmission line), the interface 240, and the probe 245. In such examples, the first substrate 220 may be configured to couple with the memory system 210 (e.g., the interface 230) at a surface 255. Additionally, an interface 240 may positioned on the surface 255 of the first substrate 220. The first substrate 220 may also include a resistor 225. In some examples, the first substrate 220 may comprise a conductive line 260 that couples the resistor 225 to the interface 240. The first substrate 220 may also be configured to couple with the second substrate 215 at an interface 270 or at a second surface 285.

Resistor 225 may be coupled with the interface 230 via the contacts (e.g., BGA balls) of the interface 230 and the interface 240. That is, the resistor 225 may couple with a contact or BGA ball of the interface 230 (or a contact of the interface 265, which corresponds to the interface 230) and a contact of the interface 240. In some cases, the resistor 225 may couple with a contact or BGA ball of the interface 230 (or a contact of the interface 265, which corresponds to the interface 230) and the conductive line 235, which couples with a contact of the interface 240. In some cases, the resistor 225 may couple with a conductive line, which couples with a contact or BGA ball of the interface 230 (or a contact of the interface 265, which corresponds to the interface 230) and the conductive line 235 or a contact of the interface 240. In some examples, the resistor 225 may be configured to isolate an impedance of testing circuit 250, interface 240 (e.g., probe interface or probe point), conductive line 235, and interface 265, or of first substrate 220 from the contacts of the memory system 210 to increase signal measurement accuracy—e.g., to ensure the signal measured at the testing circuit 250 is the same as the signal communicated by the memory system 210. In some examples, the closer the resistor 225 is the contacts, the more isolation the resistor 225 may be capable of providing. Accordingly, the resistor 225 may be configured to be positioned on the surface 255 of the first substrate 220 to be relatively close to the contacts of the memory system 210—e.g., as a surface-mount chip resistor.

In some examples, resistor 225 may be replaced by a different resistor 225 with a different resistance value. That is, a resistance of the system 200 may be adjusted by utilizing different resistors 225 having different resistive values to impedance match with the testing circuit 250. In one example, the resistor 225 is an example of a 01005 resistor. In such examples, the resistor 01005 may have a length of 0.4 mm by 0.2 mm in width, with a height between 0.1 mm to 0.2 mm. In some examples, the area of the resistor 225 may be significantly smaller as compared with other transistors—e.g., twenty-five percent (25%) smaller than a 0201 resistor. Resistor 225 may also utilize a relatively small amount of solder paste. Accordingly, resistor 225 may be relatively small enough to be positioned on the surface 255 of the first substrate 220 and be between the contacts of the memory system 210 to obtain better filtering. By being relatively close to the contacts, the resistor 225 may be configured to provide increased isolation from the testing circuit 250, the interface 240 (e.g., probe interface or probe point), or an impedance of the first substrate 220. In some examples, the surface mount resistor (e.g., a 01005 resistor) may be used if the pitch of the first substrate 220 is above a threshold (e.g., 0.65 mm).

Testing circuit 250 may be configured to measure a signal of the memory system 210 and determine signal integrity of the memory system 210. The testing circuit 250 may comprise probe 245. In some examples, testing circuit 250 is configured to receive a signal from memory system 210 by using a probe 245 at the interface 240. In some examples, testing circuit 250 may determine an error associated with the memory system 210 via receiving the signal. In other examples, the testing circuit 250 may determine an absence of an error associated with the memory system 210 via receiving the signal.

In some examples, the memory system 210 may be operating in a normal mode. In such examples, the memory system 210 may execute access operations received from the host system 205. In the normal mode, the memory system 210 may receive signals from the host system 205 via the second substrate 215 at the interface 230. That is, the interface 230 may comprise a plurality of BGA balls coupled with the second substrate 215 and the conductive lines 260. In the normal mode, the first substrate 220 and the testing circuit 250 may not be included in the system 200. In some examples, a user may cause signals communicated by the memory system 210 to be tested to ensure the memory system 210 is functioning properly—e.g., a testing circuit 250 may measure an integrity of the signals communicated by the memory system 210. In such examples, the first substrate 220 may be inserted between the second substrate 215 and the memory system 210. The testing operation may occur during manufacturing or after production while performing diagnostics or troubleshooting on the memory system 210. Accordingly, the first substrate 220 may be utilized by a manufacturer of the memory system or shipped to a customer of the memory system and used by a customer to test the memory system 210.

In some examples, it may be difficult to insert a first substrate 220 to accurately measure the signals communicated by the memory system 210. For example, signal measurement accuracy may be reduced due to a size of the memory system 210 or an impedance of the first substrate 220 or the testing circuit 250. To compensate for the external impedances, the first substrate 220 may utilize a resistor 225 to isolate the testing circuit 250 and impedance of the first substrate 220. The closer the resistor 225 is to a source of the signals communicated by the memory system 210, the greater the isolation provided by resistor 225. That is, the closer the resistor 225 is to the interface 230 (e.g., the contacts or BGA balls), the better the isolation provided. In other examples, a resistor 225 may be manufactured to be within the first substrate 220—e.g., the resistor 225 may be a buried resistor. In such examples, though, a cost and duration to manufacture the buried resistor may be relatively large. Additionally, the buried resistor may mitigate a portion of the impacts of the impedance of the first substrate 220 or testing circuit 250. For example, an accuracy of the signal with the buried resistor may be ±twenty percent (20%). In some cases, the buried resistor may also be limited to one resistance value. That is, the buried resistor may be manufactured with one (1) resistance value and be without any mechanism to adjust or tune the resistance value after manufacturing. In such examples, the system 200 may use a unique first substrate 220 for each memory system 210 having different characteristics, further increasing costs and manufacturing times.

As described herein, during a testing operation or mode, the first substrate 220 illustrated may be inserted between the second substrate 215 and memory system 210. The first substrate 220 may include a resistor 225 positioned on a surface 255 of the first substrate 220. In some examples, the resistor 225 may also be coupled with the interface 230. That is, the resistor 225 may be small enough to be positioned on the surface 255 and couple with at least one contact (e.g., BGA ball) of the interface 230 or the interface 265 (which may be an example of the memory system interface). Accordingly, the resistor 225 may be relatively close to the source of the signals communicated by the memory system 210 and provide improved isolation as compared with other solutions. The first substrate 220 may route signals from the resistor 225 to the interface 240 on the surface 255 via the conductive line 235 during the testing operation. Accordingly, the testing circuit 250 may measure a signal at the memory system 210 by utilizing a probe 245 to detect the signal at the interface 240. In some examples, the testing circuit 250 may measure signal integrity of the signals communicated by the memory system 210 and determine whether an error is associated with the memory system 210.

By implementing the first substrate 220 with the resistor 225 on the surface 255 during the testing operation, the signal integrity of signals communicated between the host system 205 and the memory system 210 may be determined with greater accuracy than other solutions. That is, by being on the surface 255, the resistor 225 may be relatively close to the contacts of the interface 230. In some examples, by using the first substrate 220, the signal accuracy may be within ±one percent (1%). Additionally, a cost and duration to manufacture the first substrate 220 may be reduced.

Figure 3:
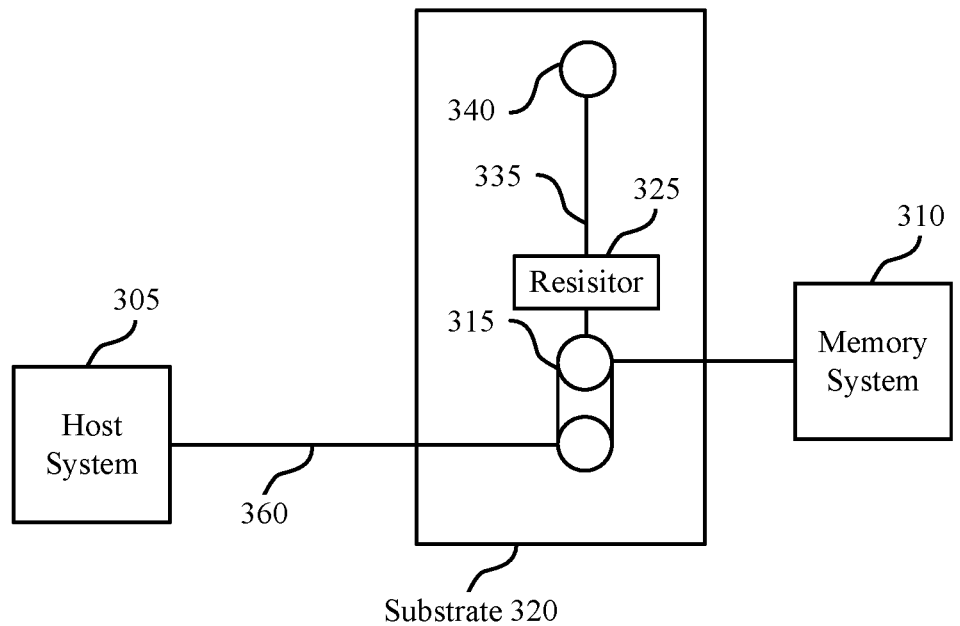
FIG. 3 illustrates an example of a system that supports testing circuit for a memory device in accordance with examples as disclosed herein.

FIG. 3 illustrates an example of a system 300 that supports testing circuit for a memory device in accordance with examples as disclosed herein. System 300 may be an example of system 200 as described with reference to FIG. 2. For example, system 300 may include examples of components described with reference to FIG. 2. Host system 305 may be an example of host system 205, memory system 310 may be an example of memory system 210, substrate 320 may be an example of first substrate 220, resistor 325 may be an example of resistor 225, conductive line 335 may be an example of conductive line 235, and probe point 340 may be an example of interface 240, as described with reference to FIG. 2, respectively.

In some examples, during a testing operation, a signal of communicated by the memory system 310 may be measured. In such examples, substrate 320 may be inserted between the host system 305 the memory system 310. That is the substrate 320 may route signals communicated with the memory system 310 to the probe point 340 for a tester (e.g., testing circuit 250 as described with reference to FIG. 2) to detect or measure. The substrate 320 may also be coupled with conductive lines 360 (e.g., conductive lines 260) of a second substrate (e.g., second substrate 215). In some examples, in response to measuring the signal of the memory system 310, an impedance of the probe point 340 (and the tester) may impact the measurement. To reduce the impact, a resistor 325 may be configured to isolate the impedance at probe point 340 from the signal communicated by the memory system 310. In some examples, the closer the resistor 325 is to contacts (e.g., BGA balls) 315 of the memory system 310, the greater the isolation the resistor 325 may provide that may result in the signal communicated between the host system 305 and the memory system 310 being less affected by the probe point 340 and other components of the substrate 320.

In some examples, to provide isolation, the substrate 320 may use a buried resistor. In such examples, the buried resistor may be manufactured within substrate 320. Accordingly, the buried resistor may not be as close as possible to the contacts 315. Additionally, a resistance of the buried resistor may not be changed. As such, it may be difficult to match the impedance of the probe point 340—e.g., the accuracy of the signal measured by the tester may be impacted by the impedance of the probe point 340 and the conductive lines and other components associated with the probe point 340.

As described herein, substrate 320 may include a resistor 325 on a surface of the substrate 320. The resistor 325 may be closer electrically and physically to the contacts 315 in response to being positioned on the surface. Additionally, a user may swap (or modify) resistor 325 for a new resistor 325 with a different resistance value to match the impedance of the probe point 340. Accordingly, the resistor 325 may provide greater isolation by being located relatively close to the contacts 315 and having an adjustable resistance for the substrate 320. By having greater isolation, the impedance of the probe point 340 may have a lessened impact on the signal measured at the memory system 310—e.g., the signal at the contacts 315. This may enable the tester to receive a more accurate measurement of a true signal at the contact 315.

Figure 4:
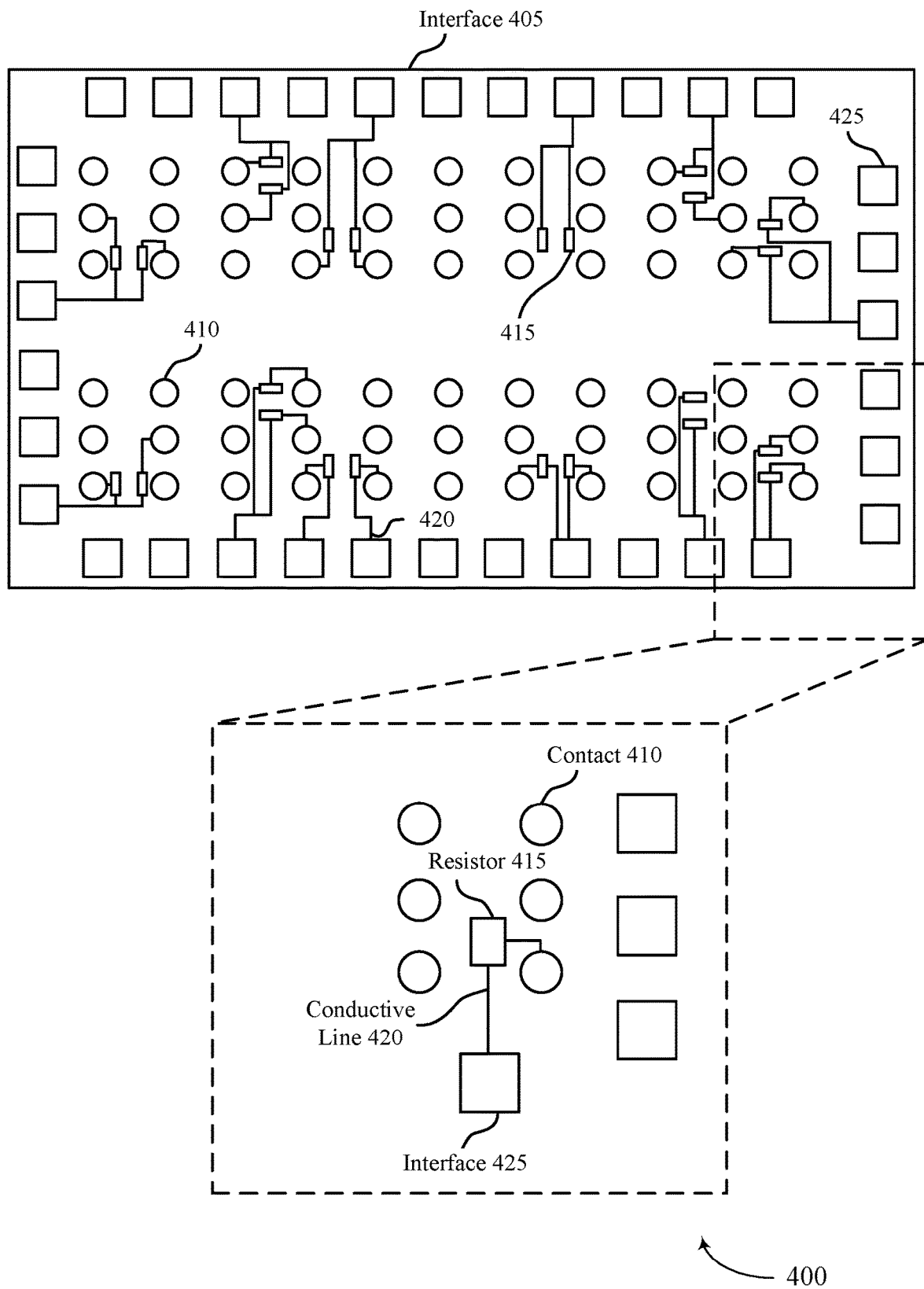
FIG. 4 illustrates an example of a substrate that supports testing circuit for a memory device in accordance with examples as disclosed herein.

FIG. 4 illustrates an example of a substrate 400 that supports testing circuit for a memory device in accordance with examples as disclosed herein. The substrate 400 may be an example of first substrate 220 as described with reference to FIG. 2. FIG. 4 may illustrate a top surface (e.g., surface 255 as described with reference to FIG. 4). Substrate 400 may include resistors 415 (e.g., resistor 225 as described with reference to FIG. 2), conductive lines 420 (e.g., conductive line 235 as described with reference to FIG. 2), and interfaces 425 (e.g., interface 240 as described with reference to FIG. 2). In some examples, the substrate 400 may be coupled with contacts 410 of a memory system interface (e.g., interfaces as described with reference to FIG. 2) of a memory system (e.g., memory system 210 as described with reference to FIG. 2).

In some examples, during a testing operation, substrate 400 may be inserted between the memory system and a second substrate (e.g., second substrate 215 as described with reference to FIG. 2) to measure signals communicated between a host system (e.g., host system 205 as described with reference to FIG. 2) and the memory system. For example, during a testing operation, signals may be communicated by the memory system. The substrate 400 may route a signal from contact 410 of the memory system at a first surface (e.g., surface 255) to interface 425 on the same surface via resistor 415 and conductive line 420. That is, the substrate 400 may comprise a plurality of resistors 415 to measure signals at different contacts 410 of the interfaces. In some examples, the signal at the interface 425 may be measured by a tester (e.g., testing circuit 250 as described with reference to FIG. 2) to measure signal integrity.

In some examples, a top surface of the substrate 400 (e.g. surface 255) may be coupled with contacts 410 of the interfaces. In some examples, the contacts 410 may be BGA balls coupled with interconnect lines of the interfaces. The contacts 410 may route signals received to components of the memory system. In some examples, the contacts may have a pitch—e.g., the pitch may be a minimum center-to-center distance between interconnect lines or between components of the system. That is, the pitch may be a distance between a center of a first contact 410 and a center of a second contact 410. In some examples, the contacts 410 may have a half pitch—e.g., an approximate minimum linewidth.

In some cases, to improve isolation from an impedance of the interface 425, resistors 415 may be positioned as close to contacts 410 as possible. In such examples, a size of the resistor 415 may depend on the pitch of the memory system—e.g., based on an electrical distance or impedance between the contacts 410. That is, the resistor 415 may have a size such that it is positioned on the top surface of the substrate 400 and between a first contact 410 and a second contact 410. In some examples, the resistor 415 may be a 01005 resistor. In such examples, the resistor 415 may couple to a memory system with a pitch of the contacts 410 greater than 0.65 mm. That is, based on the size of the resistor 415, the substrate 400 may be configured to measure a signal at any memory system having a BGA package with a pitch larger than 0.65 mm.

In some examples, the resistors 415 may be electrically and physically closer to the contacts 410 than compared with other solutions. That is, as shown in FIG. 4, the resistor 415 may be coupled directly with a first contact 410 while being positioned between a second contact 410. Accordingly, the resistor 415 may isolate an impedance of interface 425 from a contact 410. In such examples, the tester coupled with the interface 425 may more accurately measure a signal that is closer to a true value of the signal at the contacts 410.

An apparatus is described. The apparatus may include a memory system including contacts configured to route signals to different regions of the memory system, a first substrate including a memory system interface coupled with the memory system and a probe interface, the first substrate configured to route a signal of the memory system to the probe interface, the first substrate including a resistor coupled with the contacts of the memory system, and a second substrate coupled with a host system interface of the first substrate and configured to receive the signal of the memory system from the memory system interface.

In some examples of the apparatus, the first substrate further includes a first surface coupled with the memory system and that includes the memory system interface and the probe interface, and the resistor may be coupled with the first surface.

In some cases of the apparatus, the resistor may be coupled between a first contact of the memory system interface of the first substrate and a second contact of the probe interface.

In some instances of the apparatus, a size of the resistor may be based at least in part on an impedance between the first contact and the second contact.

In some examples of the apparatus, the contacts may be arranged with a pitch and a size of the resistor may be based at least in part on the pitch of the contacts.

In some cases, the apparatus may include a host system associated with the memory system coupled with the second substrate, the second substrate configured to route signals associated with the memory system between the first substrate and the host system.

In some instances, the apparatus may include a tester configured to couple with the probe interface and configured to measure the signal routed by the first substrate to the probe interface.

In some examples of the apparatus, the tester may be further configured to determine an error associated with the memory system based at least in part on measuring the signal.

In some cases of the apparatus, the resistor may be configured to isolate an impedance of the tester from the memory system.

In some instances of the apparatus, the first substrate further includes a conductive line coupled with the resistor and the probe interface.

In some examples of the apparatus, the first substrate includes a second resistor and the resistor may have a first resistance the second resistor may have a second resistance different than the first resistance.

In some cases of the apparatus, the resistor includes a surface-mount chip resistor.

In some instances of the apparatus, the resistor includes a 01005 component.

Another apparatus is described. The apparatus may include a first substrate, a first interface coupled with a first surface of the first substrate and configured to couple with contacts of a memory system, a second interface coupled with a second surface of the first substrate and configured to couple with a second substrate that includes a host system associated with the memory system, and a third interface coupled with the first surface of the first substrate and coupled with the first interface, the third interface configured to output a signal of the memory system occurring at the contacts, the third interface including a resistor coupled with the first surface of the first substrate.

In some examples of the apparatus, the third interface may be further configured to couple with a tester and output the signal of the memory system to the tester.

In some cases of the apparatus, the resistor may be further configured to isolate an impedance of the tester from the memory system.

In some instances of the apparatus, the third interface includes a plurality of resistors coupled with the first surface and coupled with the contacts of the memory system.

In some examples of the apparatus, the third interface includes a conductive line coupled with the resistor and a probe point of the third interface, the signal outputted at the probe point.

In some examples of the apparatus, the third interface may be configured to include a second resistor and the resistor may have a first resistance the second resistor may have a second resistance different than the first resistance.

A system is described. The system may include a device-under-test including a memory system, a first substrate including a first interface coupled with the memory system and configured to route a signal of the memory system from the first interface to a second interface of the first substrate and a third interface of the first substrate, the first substrate including a resistor on a first surface of the first substrate, a second substrate coupled with the second interface of the first substrate, a host system coupled with the second substrate, and a tester including a probe that is configured to couple with the third interface of the first substrate, the tester configured to measure the signal of the memory system.

In some examples of the system, the resistor may be configured to isolate an impedance of the tester from the memory system.

In some cases of the system, the resistor includes a surface-mount chip resistor.

In some examples of the system, the tester may be configured to determine an error associated with the memory system based at least in part on measuring the signal of the memory system.

In some instances of the system, the tester may be configured to determine an absence of errors associated with the memory system based at least in part on measuring the signal of the memory system.

In some cases of the system, the second substrate may be configured to communicate signals between the host system and the memory system.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. In response to a component, such as a controller, coupling other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other in response to the switch being open. In response to a controller isolating two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" in response to a voltage greater than or equal to the transistor's threshold voltage is applied to the transistor gate. The transistor may be "off" or "deactivated" in response to a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory system comprising contacts configured to route signals to different regions of the memory system;
a first substrate comprising a memory system interface coupled with the memory system and a probe interface, the first substrate configured to route a signal of the memory system to the probe interface, the first substrate comprising a resistor coupled with the contacts of the memory system; and
a second substrate coupled with a host system interface of the first substrate and configured to receive the signal of the memory system from the memory system interface.

2. The apparatus of claim 1, wherein:
the first substrate further comprises a first surface coupled with the memory system and that includes the memory system interface and the probe interface, the resistor is coupled with the first surface.

3. The apparatus of claim 1, wherein the resistor is coupled between a first contact of the memory system interface of the first substrate and a second contact of the probe interface.

4. The apparatus of claim 3, wherein a size of the resistor is based at least in part on an impedance between the first contact and the second contact.

5. The apparatus of claim 1, wherein:
the contacts are arranged with a pitch; and
a size of the resistor is based at least in part on the pitch of the contacts.

6. The apparatus of claim 1, further comprising:
a host system associated with the memory system coupled with the second substrate, the second substrate configured to route signals associated with the memory system between the first substrate and the host system.

7. The apparatus of claim 1, further comprising:
a tester configured to couple with the probe interface and configured to measure the signal routed by the first substrate to the probe interface.

8. The apparatus of claim 7, wherein the tester is further configured to determine an error associated with the memory system based at least in part on measuring the signal.

9. The apparatus of claim 7, wherein the resistor is configured to isolate an impedance of the tester from the memory system.

10. The apparatus of claim 1, wherein the first substrate further comprises a conductive line coupled with the resistor and the probe interface.

11. The apparatus of claim 1, wherein:
the first substrate comprises a second resistor; and
the resistor has a first resistance the second resistor has a second resistance different than the first resistance.

12. The apparatus of claim 1, wherein the resistor comprises a surface-mount chip resistor.

13. The apparatus of claim 1, wherein the resistor comprises a 01005 component.

14. An apparatus, comprising:
a first substrate;
a first interface coupled with a first surface of the first substrate and configured to couple with contacts of a memory system;
a second interface coupled with a second surface of the first substrate and configured to couple with a second substrate that comprises a host system associated with the memory system; and
a third interface coupled with the first surface of the first substrate and coupled with the first interface, the third interface configured to output a signal of the memory system occurring at the contacts, the third interface comprising a resistor coupled with the first surface of the first substrate.

15. The apparatus of claim 14, wherein the third interface is further configured to couple with a tester and output the signal of the memory system to the tester.

16. The apparatus of claim 15, wherein the resistor is further configured to isolate an impedance of the tester from the memory system.

17. The apparatus of claim 14, wherein the third interface comprises a plurality of resistors coupled with the first surface and coupled with the contacts of the memory system.

18. The apparatus of claim 14, wherein the third interface comprises a conductive line coupled with the resistor and a probe point of the third interface, the signal outputted at the probe point.

19. The apparatus of claim 14, wherein:
the third interface is configured to comprise a second resistor; and
the resistor has a first resistance the second resistor has a second resistance different than the first resistance.

20. A system, comprising:
a device-under-test comprising:
a memory system;
a first substrate comprising a first interface coupled with the memory system and configured to route a signal of the memory system from the first interface to a second interface of the first substrate and a third interface of the first substrate, the first substrate comprising a resistor on a first surface of the first substrate;
a second substrate coupled with the second interface of the first substrate; and a host system coupled with the second substrate; and a tester comprising a probe that is configured to couple with the third interface of the first substrate, the tester configured to measure the signal of the memory system.

21. The system of claim 20, wherein the resistor is configured to isolate an 2 impedance of the tester from the memory system.

22. The system of claim 20, wherein the resistor comprises a surface-mount chip resistor.

23. The system of claim 20, wherein the tester is configured to determine an error associated with the memory system based at least in part on measuring the signal of the memory system.

24. The system of claim 20, wherein the tester is configured to determine an absence of errors associated with the memory system based at least in part on measuring the signal of the memory system.

25. The system of claim 20, wherein the second substrate is configured to 2 communicate signals between the host system and the memory system.

* * * * *